United States Patent
Tsunashima et al.

[11] Patent Number: 6,133,121
[45] Date of Patent: Oct. 17, 2000

[54] APPARATUS FOR SUPPORTING SEMICONDUCTOR WAFERS AND SEMICONDUCTOR WAFER PROCESSING METHOD USING SUPPORTING APPARATUS

[75] Inventors: Yoshitaka Tsunashima; Katsuya Okumura; Shigeru Yonemoto, all of Yokohama, Japan

[73] Assignee: Kabushiki Kaisha Toshiba, Kawasaki, Japan

[21] Appl. No.: 08/950,913

[22] Filed: Oct. 15, 1997

[51] Int. Cl.[7] ..................................... C23C 16/00
[52] U.S. Cl. ................. 438/478; 438/584; 427/248.1; 118/500; 118/728
[58] Field of Search .................... 118/500, 728; 427/248.1; 438/478, 584

[56] References Cited

U.S. PATENT DOCUMENTS

| 5,169,684 | 12/1992 | Takagi ................................... 118/728 |
| 5,192,371 | 3/1993 | Shuto et al. ............................ 118/728 |
| 5,219,079 | 6/1993 | Nakamura ................................ 211/41 |
| 5,443,649 | 8/1995 | Sibley .................................... 118/728 |
| 5,468,112 | 11/1995 | Ishii et al. ............................. 414/416 |
| 5,482,559 | 1/1996 | Imai et al. ............................. 118/728 |
| 5,494,524 | 2/1996 | Inaba et al. ........................... 118/728 |
| 5,507,873 | 4/1996 | Ishizuka et al. ....................... 118/728 |
| 5,534,074 | 7/1996 | Koons ................................... 118/728 |

*Primary Examiner*—Richard Bueker
*Attorney, Agent, or Firm*—Banner & Witcoff

[57] ABSTRACT

A plurality of rods are arranged between first and second plates. A plurality of support members formed of heat-resistant strings, for example, SiC are stretched between the rods and wafers are supported by the support members. The wafers are separated from the rods while they are supported on the support members.

29 Claims, 8 Drawing Sheets

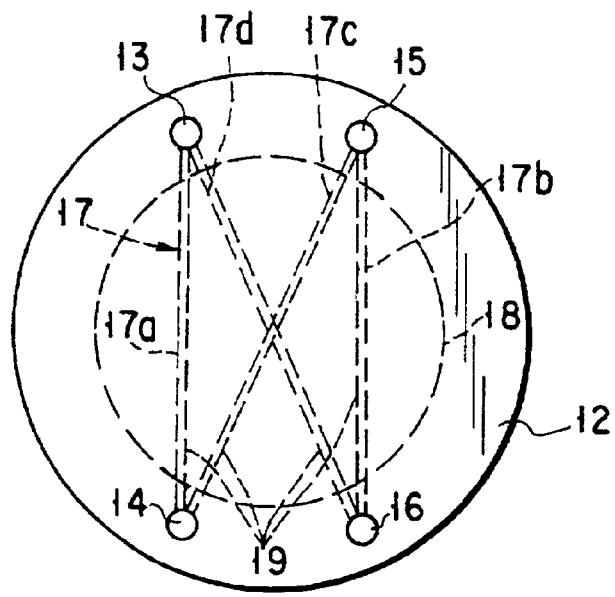
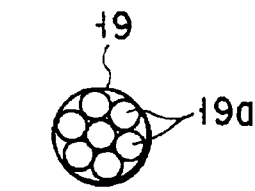
FIG. 2A
FIG. 2B
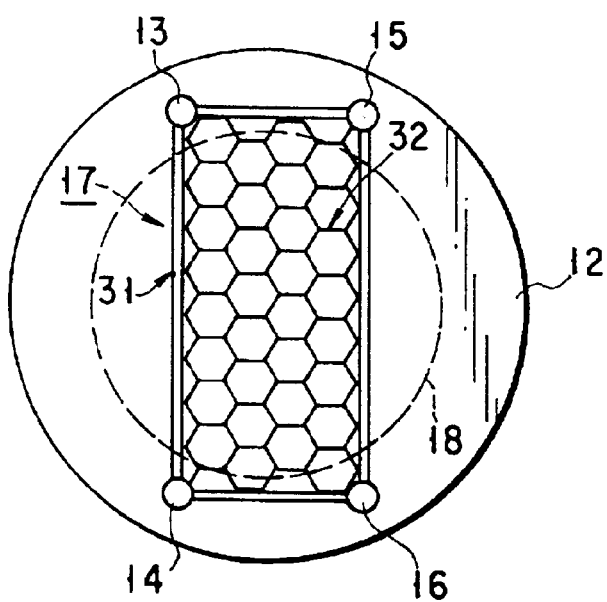
FIG. 3

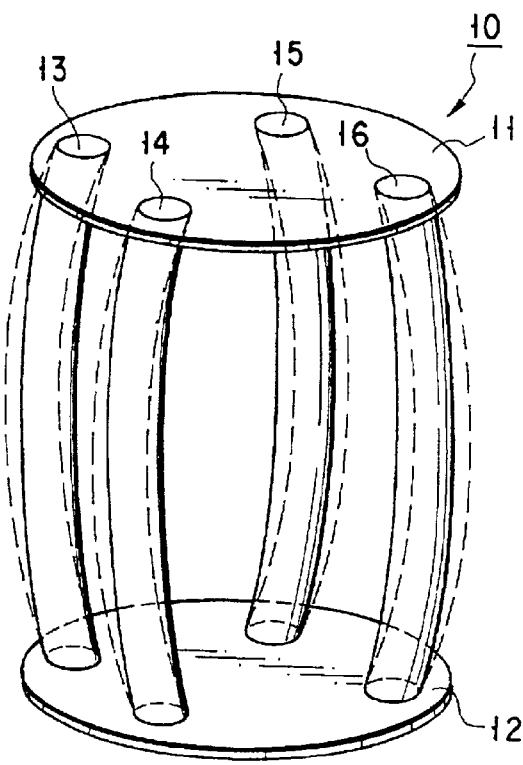
F I G. 4
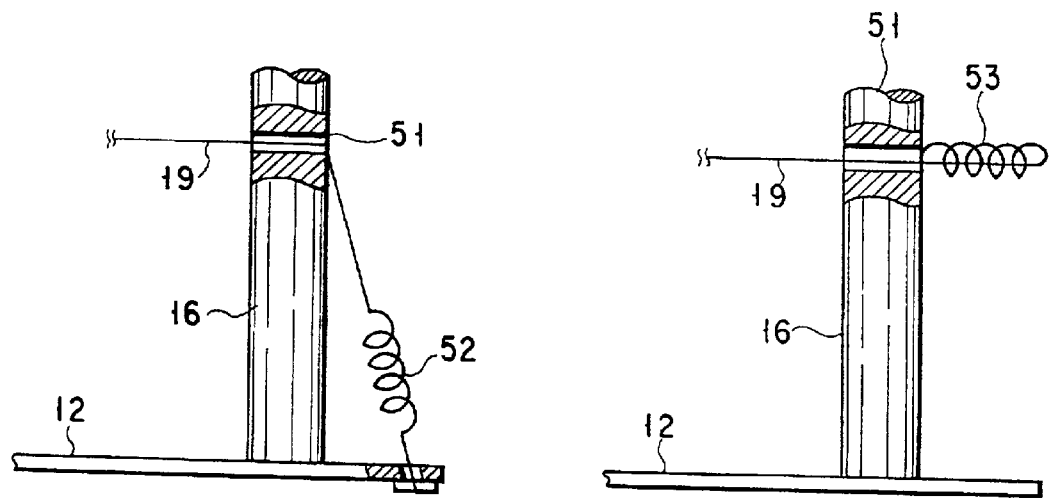
F I G. 5A          F I G. 5B

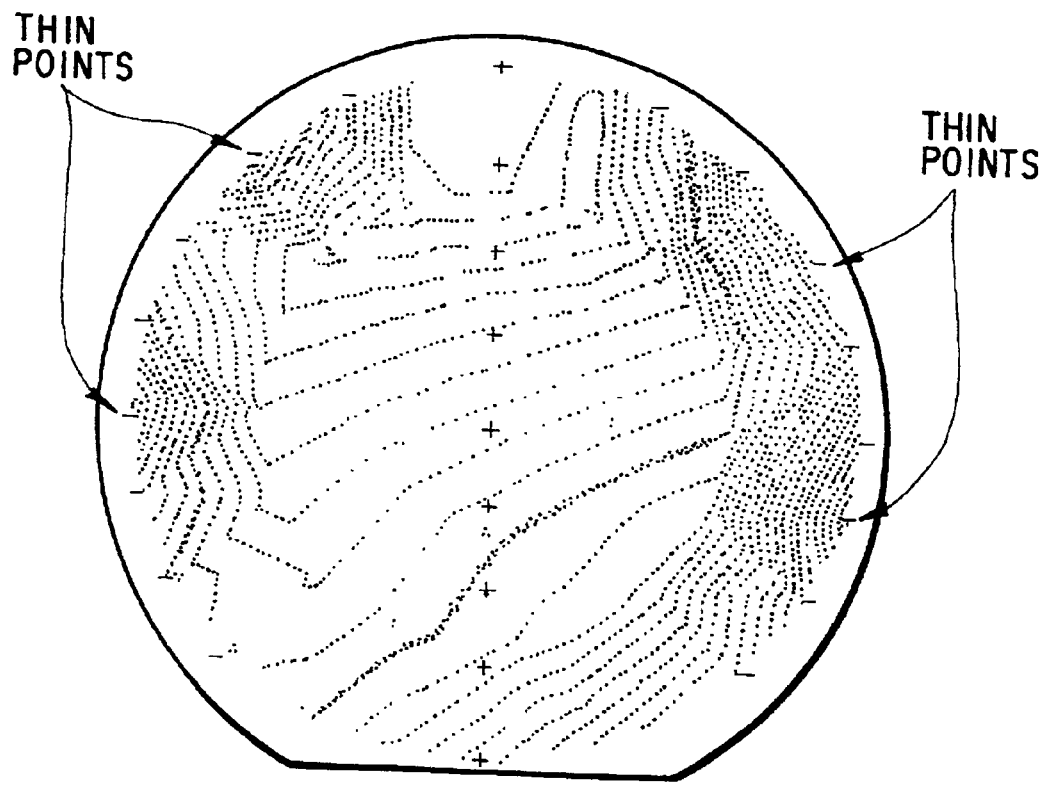
F I G. 10

APPARATUS FOR SUPPORTING SEMICONDUCTOR WAFERS AND SEMICONDUCTOR WAFER PROCESSING METHOD USING SUPPORTING APPARATUS

BACKGROUND OF THE INVENTION

This invention relates to a supporting apparatus for supporting semiconductor wafers when the semiconductor wafers are subjected to the heat treatment, for example, and a semiconductor wafer processing method using the supporting apparatus.

High temperature processes in a semiconductor device manufacturing method such as oxidation, annealing and LPCVD (Low Pressure Chemical Vapor Deposition) are effected by use of a furnace type tool. At present, a vertical furnace is generally used. The vertical furnace includes a quartz tube and boat which are stood up vertically and can process 100 or more wafers within one batch. However, the vertical furnace requires a long process time. This is mainly because of its large batch size of one process. If the number of wafers processed at one time is large, a relatively long time is required in each of the processing steps. That is, it takes a long time to transfer the wafers between the cassettes and the boats and a long time is taken until the temperature in the furnace becomes constant after the boat having the wafers mounted thereon is loaded into the furnace. Further, it takes a long time to raise or lower the temperature in the furnace and a relatively long process time is required because of the low film growth rate for maintaining the uniformity. Even if it takes a long process time, the batch size of the vertical furnace is large, and therefore, the throughput is relatively higher than the other type of semiconductor manufacturing device. However, recently, when advanced devices having a larger number of complicated manufacturing steps are developed, it is strongly required to reduce the processing time in order to enhance the turn around time. Therefore, it is desired to develop an apparatus and process with high throughput and short process time.

A mini-batch furnace is a means for satisfying the above requirements. The process time of several steps can be automatically reduced by reducing the batch size. However, the actual process time cannot be easily reduced simply by reducing the batch size. The same process time is required in the same processing condition even when the mini-batch furnace is used. In order to solve this problem, it is required to attain a higher film formation rate according to a new process condition suitable for the apparatus.

A condition of high temperature, high pressure and high gas flow rate using a wide-pitch wafer boat is a preferable measure. In the new process condition, the control operation for maintaining the uniformity in the film thickness in the wafer is one of the important issues. That is, because of its high film formation rate, a subtle difference in the distribution of gas pressure, content and flow rate will sensitively affect the uniformity of the film thickness.

Now, a new process condition is explained by taking a case wherein a BPSG (Boro-Phospho-Silicate Glass) film is formed by use of an LPCVD (low pressure chemical vapor deposition) method as an example.

FIG. 9A shows a conventional boat. The boat 100 is formed of quartz, for example, and has four rods 101 to 104 for supporting wafers 106. Each of the rods 101 to 104 has a plurality of slits 105 for supporting the wafers 106.

FIG. 10 shows a contour map of the film thickness of a BPSG film in a typical wafer in a case where the BPSG film is formed based on a new process condition by use of a conventional boat. It is clearly seen from FIG. 10 that four thin-film areas are present on the edge portion of the wafer. As shown in FIG. 9B, thin-film portions 107 lie on the outer edge portion of the wafer 106 and correspond in position to the rods 101 to 104 of the boat 100. The reason why the film thickness of areas near the rods 101 to 104 is reduced is considered as follows.

(1) The rods shield radiation heat from a resistance heater and the temperature of the portions of the wafer lying near the rods will not be sufficiently raised.

(2) The boat rods interrupt the process gas flow and the amount of gas which is brought into contact with the wafer is reduced.

(3) The boat rods construct a heat conduction path and the temperatures of portions of the wafer which are set in contact with the rods are lowered.

In the cases (1) and (3), the wafer temperature is locally lowered and the film deposition rate is lowered. In the case (2), the amount of a reaction gas is locally reduced and the film deposition rate is lowered. Thus, the conventional boat has various problems and it is desired to improve the boat.

BRIEF SUMMARY OF THE INVENTION

A first object of this invention is to provide a support apparatus for supporting semiconductor wafers in each of which a film with a uniform film thickness can be formed on the wafer surface.

A second object of this invention is to provide a method for processing semiconductor wafers in each of which a film with a uniform film thickness can be formed on the wafer surface.

The first object of this invention can be attained by a support apparatus for supporting semiconductor wafers comprising a first plate; a second plate arranged in opposition to the first plate; a plurality of rods arranged between the first and second plates, the interval between the rods being set to be larger than the diameter of the semiconductor wafer; and a plurality of linear supporting members arranged between the plurality of rods, the supporting members being used for supporting the semiconductor wafers.

The supporting member is formed of a heat-resistant string, for example, SiC fiber.

According to this invention, wafers to be processed are supported by the linear supporting members. Since the wafer is separated from the rods, a bad influence by the rods can be suppressed and the thickness of a film formed on the wafer surface can be made uniform.

The supporting member is formed of a heat-resistant string and the diameter of the string is extremely small. Therefore, the string will not affect the process.

Further, the first object of this invention can be attained by a support apparatus for supporting semiconductor wafers comprising a first plate; a second plate arranged in opposition to the first plate, the second plate having a plurality of slits; a plurality of rods arranged between the first and second plates, the interval between the rods being set to be larger than the diameter of the semiconductor wafer; a plurality of strings, one-side ends of the strings being mounted on the first plate and the other side ends thereof extending through the corresponding slits of the second plate and being positioned on the rear surface of the second plate; and a plurality of guards respectively provided on the strings, the guards being used to hold the semiconductor wafer.

The strings are formed of a heat-resistant material, for example, SiC fiber.

According to this invention, since semiconductor wafers are each held by a plurality of guards provided on the respective strings, a bad influence by the rods can be suppressed and the thickness of a film formed on the wafer surface can be made uniform. Further, in the case of this invention, a plurality of wafers can be simultaneously mounted on or removed from the support apparatus, the throughput can be enhanced.

The second object of this invention can be attained by a method for processing semiconductor wafers which comprises the steps of supporting semiconductor wafers on linear supporting members; loading the semiconductor wafers supported by the supporting members into a furnace and subjecting the semiconductor wafers to the heat treatment; and unloading the semiconductor wafers processed and supported by the supporting members from the furnace.

According to this invention, since the wafer is supported by the linear supporting member, the temperature distribution of the wafer can be made uniform and a reaction gas can be uniformly brought into contact with the wafer surface. Therefore, the thickness of the film formed on the wafer surface can be made uniform.

Since the string constructing the supporting member is extremely thin and the heat capacity thereof is small, the temperature thereof can be raised or lowered in a short time. Therefore, an influence caused when the temperature in the furnace is raised or lowered can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A is a plan view showing a support member shown in FIG. 1;

FIG. 2B is a cross sectional view showing part of the support member shown in FIG. 2A;

FIG. 3 is a plan view showing another example of the support member;

FIG. 4 is a perspective view showing a modification of the first embodiment, for illustrating a case wherein the tension of heat-resistant strings is held;

FIGS. 5A and 5B are a side view showing a modification of the first embodiment with partly cut-away portion, for illustrating another case wherein the tension of heat-resistant strings is held;

FIG. 10 is a diagram showing a contour map of the film thickness in the wafer.

DETAILED DESCRIPTION OF THE INVENTION

There will now be described embodiments of this invention with reference to the accompanying drawings.

Figure 1:
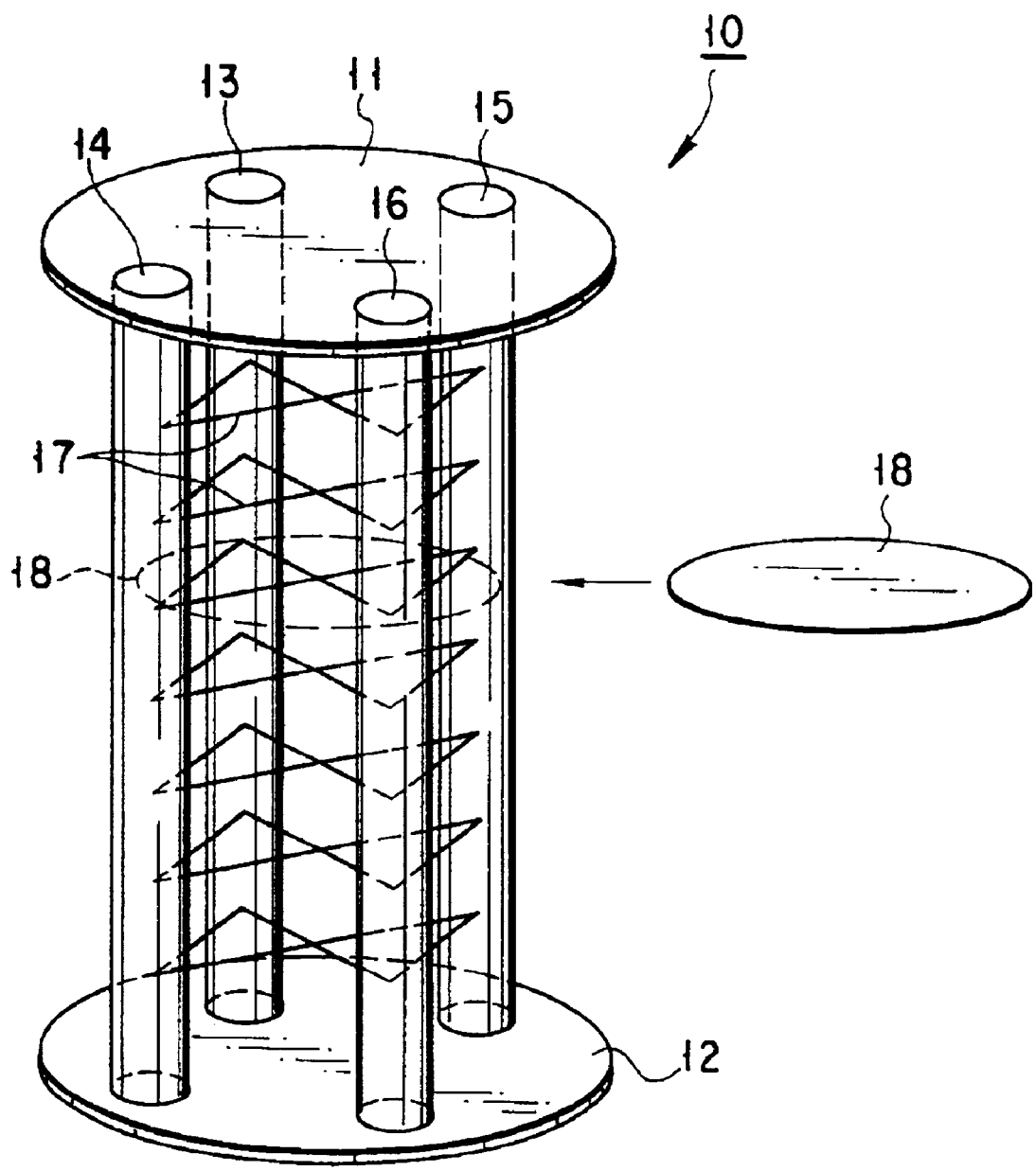
FIG. 1 is a perspective view showing a first embodiment of this invention.

FIG. 1, FIGS. 2A, 2B show a first embodiment of this invention and show a boat applied to a vertical furnace. The boat 10 has a first plate 11 and a second plate 12 and a plurality of rods 13, 14, 15, 16 are provided between the first and second plates 11 and 12. Preferably, as the material of the first and second plates 11 and 12 and the rods 13 to 16, quartz or CVD-SiC (Silicon Carbide) coated SiC may be used. As shown in FIG. 2A, the distance between the rods 13 and 14 and the distance between the rods 15 and 16 are set to be larger than the diameter of a wafer 18 and the rods 13 to 16 are disposed so as not to be set in contact with the wafer 18. A plurality of support members 17 for supporting a plurality of wafers 18 are each disposed between the rods 13 to 16 and are arranged along the rods at preset regular intervals. For example, the interval between the support members 17 is set approximately equal to the distance between the wafers received in the conventional boat, that is, the distance between the slits.

As shown in FIG. 2A, the support member is constructed by heat-resistant strings 19 stretched between the rods 13 to 16. As the material of the string 19, preferably, a spun SiC fiber may be used, for example, but it is not limited to the spun SiC fiber. The SiC fiber has a diameter of approximately 15 nm, heat resistance of 1300° C. or more, and mechanical strength of 2 GP and can be adequately used for this invention.

FIG. 2B shows the cross section of the string 19. The string 19 is constructed by bundling and spinning a plurality of SiC fibers 19a and coating SiC on the surface of the bundled and spun body. The string 19 has a diameter of approximately 0.5 mm, for example. The diameter of the string 19 is not limited to the above value and can be made larger or smaller according to the property of a wafer to be supported.

The string 19 is constructed by a first portion 17a stretched between the rods 13 and 14, a second portion 17b stretched between the rods 15 and 16 in parallel to the first portion 17a, a third portion 17c stretched between the rods 13 and 16, and a fourth portion 17d stretched between the rods 14 and 15 to intersect the third portion 17c. The way of stretching the string 19 is not limited to the above example. For example, the third and fourth portions 17c, 17d may be removed and only the first and second portions 17a, 17b may be used. In this case, since a difference in level caused by the third and fourth portions 17c, 17d intersecting each other is eliminated, the wafer can be stably supported with a simple construction.

FIG. 3 shows another way of stretching the string 19. In this case, the support member 17 has a portion 31 stretched in a rectangular form between the rods 13 to 16 and a portion 32 stretched in a mesh form inside the portion 31. With this configuration, the wafer 18 can be stably supported.

The boat 10 is inserted into a vertical furnace (not shown) with the wafers 18 supported on the respective supporting members 17. A resistance heater (not shown) and a supply pipe for supplying gas into the furnace are disposed around the vertical furnace. The wafer 18 inserted into the furnace is subjected to a process under a preset condition so as to deposit a film on the wafer 18.

According to the above embodiment, the wafer 18 is supported by the supporting member 17 constructed by the heat-resistant string 19 and is separated from the rods 13 to 16 during the process. Therefore, the radiation heat from the resistance heater can be prevented from being shielded by the rods and the temperature of portions lying near the rods of the wafer can be sufficiently raised. Further, the wafer 18 is kept apart from the rods 13 to 16 and is set in contact only with the extremely thin string 19. Therefore, since the size of the heat conduction path which is set in contact with the wafer 18 is small, the temperature distribution in the wafer surface can be made uniform. Further, since the rods do not interrupt the flow of the process gas flowing along the surface of the wafer 18, a sufficiently large amount of gas can be made in contact with the entire surface of the wafer. Thus, the temperature distribution in the entire surface of the wafer can be made uniform and the process gas can be uniformly made in contact with the entire surface of the wafer, and as a result, a film with a uniform film thickness can be formed on the surface of the wafer 18.

Since the string 19 constructing the support member 17 is extremely thin and the heat capacity thereof is small, the temperature thereof can be raised or lowered in a short time. Therefore, an influence caused when the temperature in the furnace is raised or lowered can be suppressed.

The arrangement of the rods 13 to 16 and the number of rods are not limited to the case of the above embodiment and can be selectively set if the arrangement of the rods and the number of rods will not affect the transfer of the wafer 18 and formation of the film. Further, the support member 17 is not limited to the string and another linear-form member can be used. Further, in this embodiment, a case wherein a film is formed on the wafer surface is explained, but this invention is not limited to this case and can be applied to a case of heat treatment or vapor etching process.

The environment temperature of the string 19 widely ranges from the room temperature in the wafer transfer step to the high temperature in the processing step. In order to stably hold the wafer in the wide range of temperature condition, it is necessary to always hold the string 19 with a constant tension.

FIG. 4 shows a modification of the first embodiment and shows a case wherein the tension of the string 19 is kept constant. In this example, the rods 13 to 16 are deformed according to the temperature so as to keep the tension of the string 19 constant. That is, if the ambient temperature is low, the rods 13 to 16 are slightly bent outwardly as indicated by the solid lines. If the temperature rises in this state and is set to a high level, the rods 13 to 16 are bent outwardly by a larger amount as indicated by broken lines. The amount of deformation corresponds to the amount of extension of the string 19. Therefore, even if the string 19 is extended in the high temperature state, the tension of the string 19 can be kept constant.

FIGS. 5A and 5B show a modification of the first embodiment and show another case wherein the tension of the string 19 is kept constant. In the modification of FIG. 5A, a through hole 51 which intersects the axial direction of the rod 16, for example, is formed in position of the rod 16 in which the support member 17 is disposed. One end portion of the string 19 constructing the support member 17 is passed through the through hole 51. The end portion of the string 19 lying outside the through hole 51 is fixed on the second plate 12 via a spring 52. The spring 52 is formed of the same material as that of the string 19. At normal temperature the spring 25 applies to the string 19 a tension which greater than a optimal tension for holding the wafer. When the ambient temperature rises above normal temperature, the spring 25 elongates to apply the optimum tension to the string 19.

In the modification of FIG. 5B, the spring 53 applies an optimum tension to the string 19 at normal temperature. When the ambient temperature rises above normal temperature, the spring 25 elongates as the string 19 elongates. Therefore, the tension of the string 19 can be kept constant irrespective of the ambient temperature.

Figure 6:
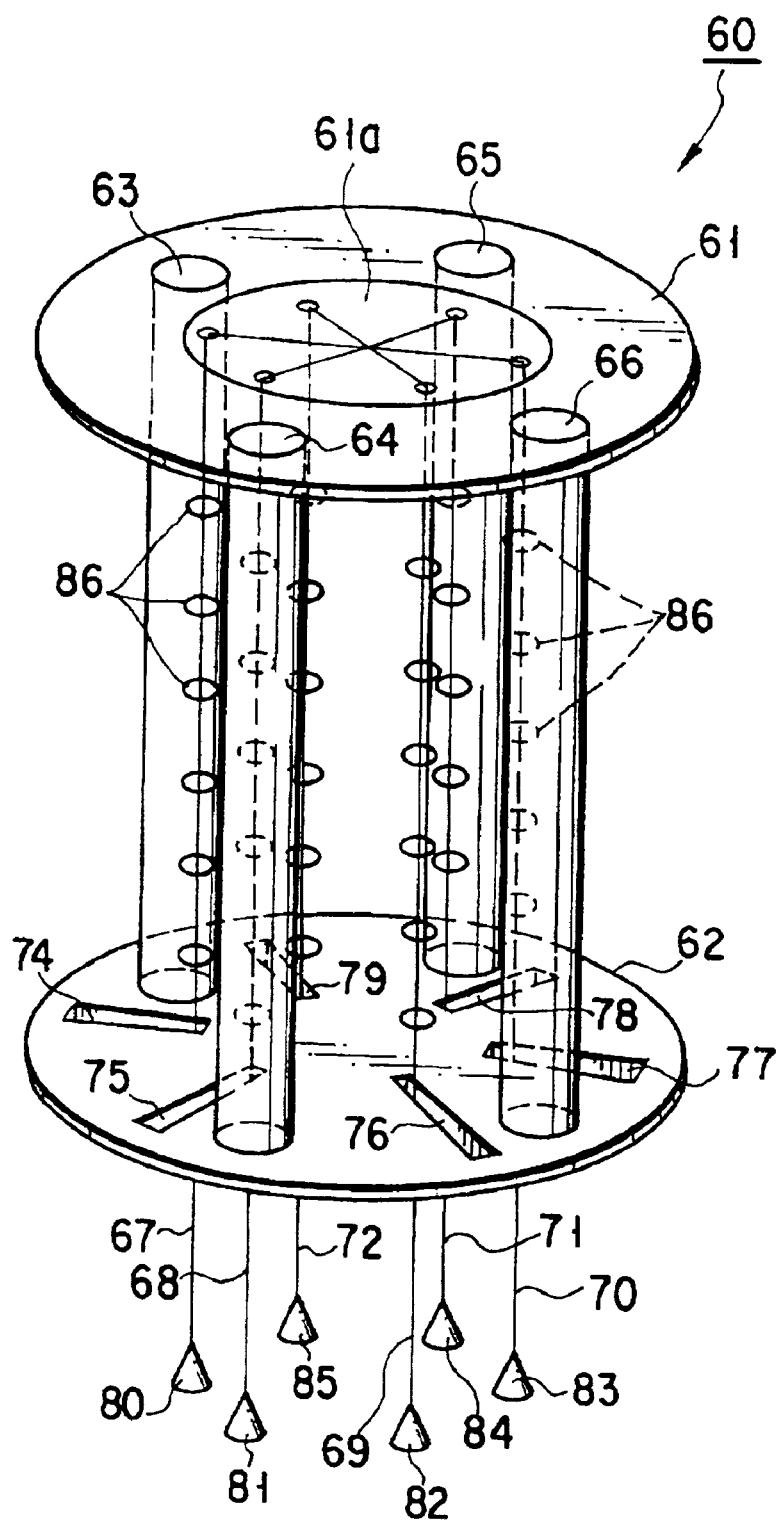
FIG. 6 is a perspective view showing a second embodiment of this invention.

FIG. 6 shows a second embodiment of this invention.

In FIG. 6, a boat 60 has a first plate (top plate) 61 of ring form, for example, and a second plate (bottom plate) 62 and a plurality of rods 63, 64, 65, 66 are provided between the first and second plates 61 and 62. Preferably, as the material of the first and second plates 61 and 62 and the rods 63 to 66, quartz or CVD-SiC coated SiC may be used. The distance between the rods 63 and 64 and the distance between the rods 65 and 66 are set to be larger than the diameter of a wafer and the rods 63 to 66 are disposed so as not to be set in contact with the wafer. The rods 63 to 66 are used only for supporting the first and second plates 61, 62 and a plurality of heat-resistant strings 67, 68, 69, 70, 71, 72 for supporting a plurality of wafers between the first and second plates 61 and 62 are disposed with a preset separation distance therebetween. The material of each of the strings 67 to 72 is the same as that of the string 19 and the diameter thereof is 0.5 mm, for example.

A third plate 61a of circular form is mounted on the central portion of the first plate 61 and one end of each of the strings 67 to 72 is fixed on the third plate 61a. The third plate 61a has a diameter slightly smaller than that of the wafer and the strings 67 to 72 are hung on and droop from the respective peripheral portions of the third plate 61a. The strings 67 to 72 are disposed between the rods 63 to 66 and the other end portions of the strings 67 to 72 are respectively passed through a plurality of slits 74, 75, 76, 77, 78, 79 which are radially formed in the second plate 62 and extend outwardly of the rear surface of the second plate 62. Weights 80, 81, 82, 83, 84, 85 are mounted on the other end portions of the respective strings 67 to 72 to give a preset tension to each string. Each of the strings 67 to 72 can be moved in a corresponding one of the slits 74 to 79 along the radial direction of the second plate 62. Further, a plurality of guards 86 for supporting a plurality of wafers are provided on portions of the strings 67 to 72 which lie between the second and third plates 62 and 61a. For example, the guards 86 are disposed on a plurality of notches (not shown) which are formed at a preset interval in each of the strings 67 to 72. The positions of the guards 86 mounted on the respective strings 67 to 72 are set to correspond to one another. The guards 86 are formed of SiC, for example.

Figure 7:
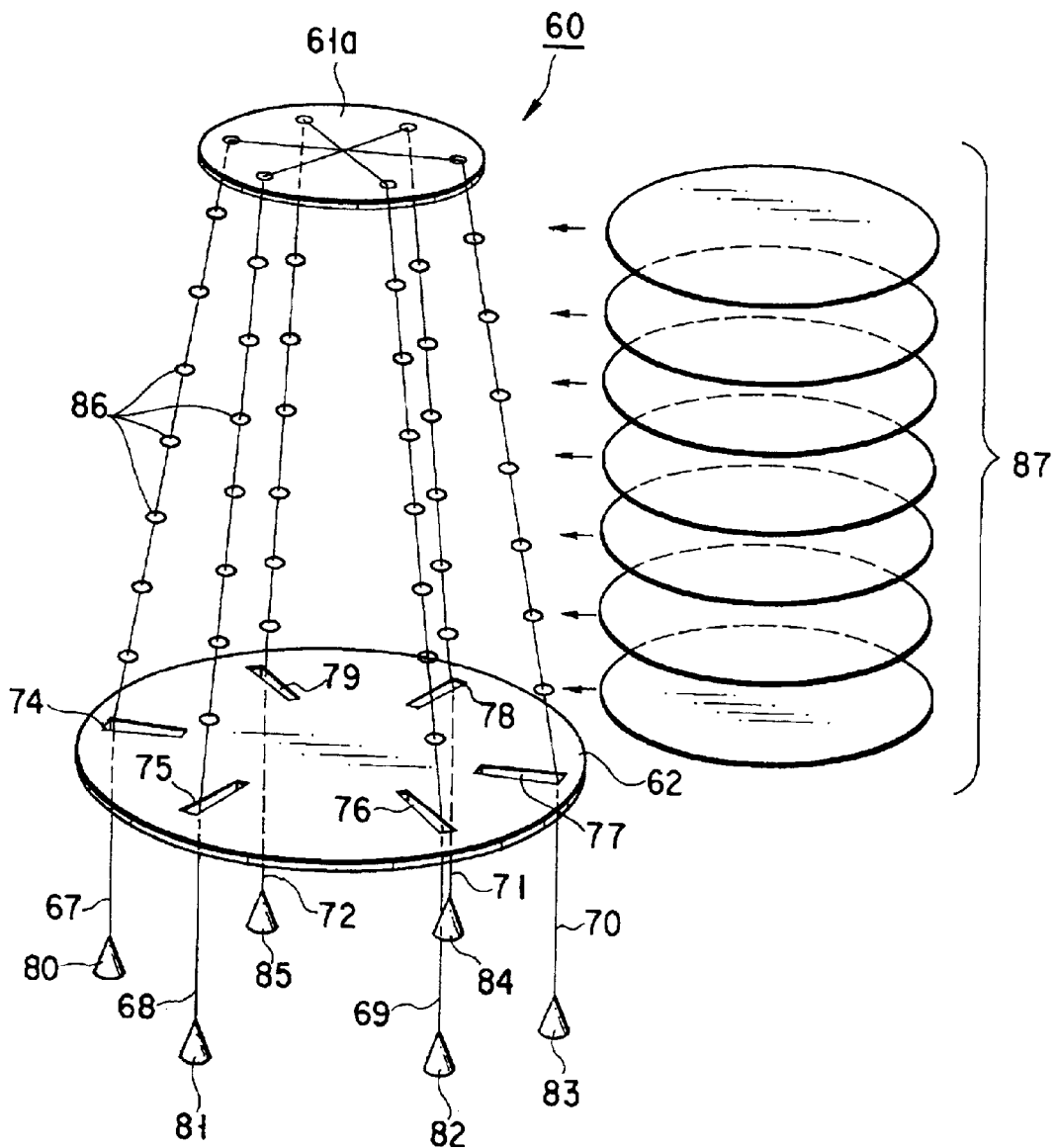
FIG. 7 is a perspective view showing only a main portion, for illustrating the operation of the second embodiment of FIG. 6.
Figure 8:
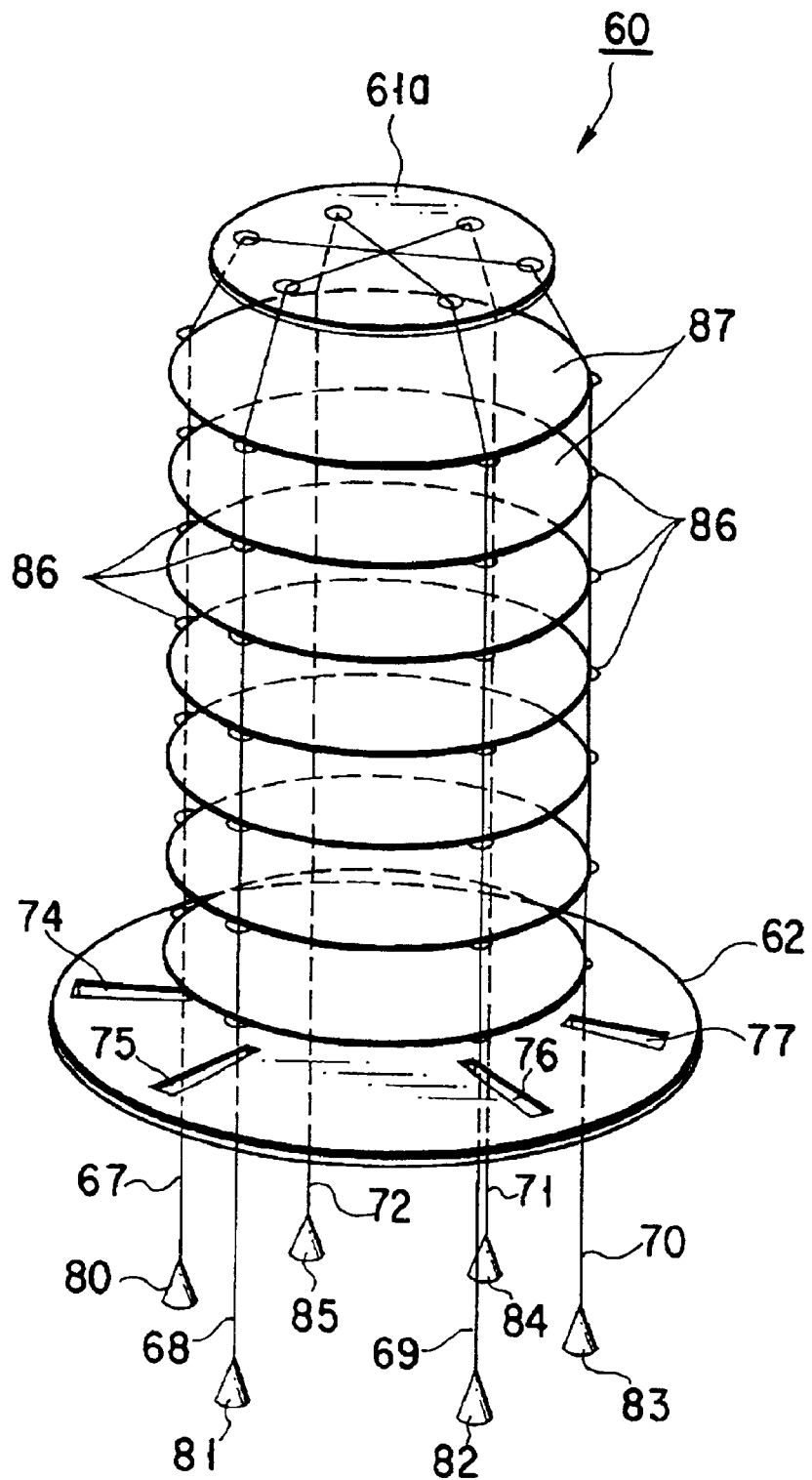
FIG. 8 is a perspective view showing only a main portion, for illustrating the operation of the second embodiment of FIG. 6.
Figure 9A:
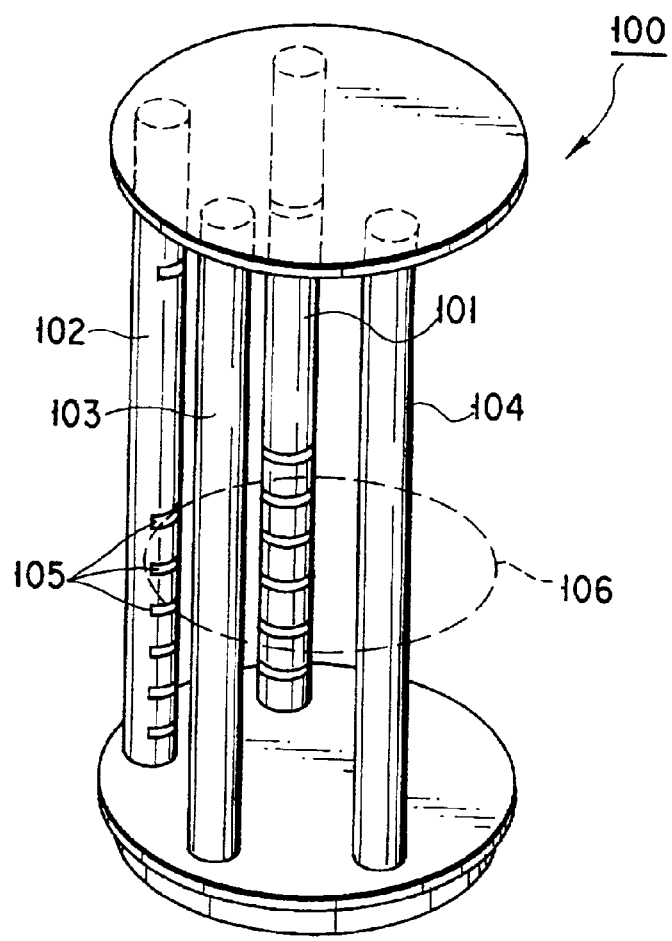
FIG. 9A is a perspective view showing a conventional boat.
Figure 9B:
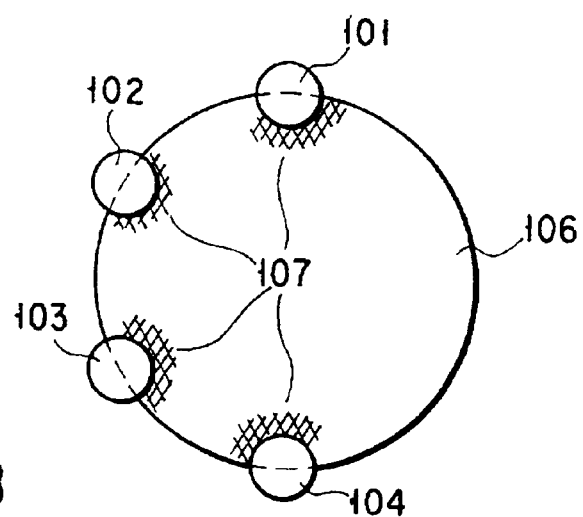
FIG. 9B is a plan view showing the relation between the rods of the conventional boat and thin film portions.

Next, the operation effected when wafers are mounted on the boat 60 with the above structure is explained with reference to FIGS. 7 and 8. In FIGS. 7 and 8, the first plate 61 and rods 63 to 66 are omitted for clarification.

As shown in FIG. 7, first, the strings 67 to 72 are moved outwardly of the second plate 62 to set the distances between the strings 67 to 72 longer. In this state, a plurality of wafers 87 are inserted into a space defined by the strings 67 to 72 between the second and third plates 62 and 61a. After this, if the strings 67 to 72 are moved inwardly of the second plate 62 to reduce the distances therebetween, the strings 67 to 72 are brought into contact with the peripheral side surfaces of the wafers 87 and the wafers 87 are supported on the corresponding guards 86 as shown in FIG. 8. Thus, the boat 60 with the wafers 87 mounted thereon is loaded into a vertical furnace (not shown) and is subjected to a preset process. After the preset process is terminated, the boat 60 is unloaded from the furnace and the wafers are taken out from the boat 60 by reversely effecting the above-described operation.

According to the second embodiment, a plurality of wafers 87 are supported by use of a plurality of heat-resistant strings 67 to 72. Since the diameter of each of the strings 67 to 72 is extremely small, the radiation heat from the resistance heater to the wafers can be prevented from being shielded by them, and since the size of the heat conduction path is small, the wafer temperature can be prevented from being lowered. Further, the strings 67 to 72 will not interrupt the process for the wafer. Therefore, a film with a uniform film thickness can be formed on each wafer surface.

Further, in this embodiment, since a plurality of wafers can be simultaneously mounted or taken out while the distances between the strings 67 to 72 are kept long, the throughput can be enhanced.

Also, in this embodiment, the diameter of the third plate 61a is set smaller than that of the wafer, but it is not limited to this case and may be set equal to that of the wafer. In this case, stresses of the strings 67 to 72 acting on the wafers can be reduced. Further, the third plate 61a is formed separately from the first plate 61, but the first and third plates may be integrally formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A support apparatus for supporting semiconductor wafers comprising:
   a first plate;
   a second plate arranged in opposition to said first plate;
   a plurality of rods arranged between said first and second plates; and
   a plurality of linear supporting members arranged between said plurality of rods, said supporting members functioning to support the semiconductor wafers,
   wherein said supporting members are formed of string.

2. An apparatus according to claim 1, wherein said string is formed of silicon carbide (SiC) fibers.

3. An apparatus according to claim 2, wherein said string has a diameter of approximately 0.5 mm.

4. An apparatus according to claim 1, wherein said string is stretched between pairs of said rods to construct said supporting members.

5. An apparatus according to claim 1, wherein said string is arranged in a mesh form between said rods to construct said supporting members.

6. An apparatus according to claim 1, wherein said string comprises heat-resistant string.

7. An apparatus according to claim 1, wherein said plurality of rods comprises four rods and a spacing between a first and a second of said rods and a spacing between a third and a fourth of said rods are each set to be larger than a diameter of the semiconductor wafers supported by said supporting members.

8. A support apparatus for supporting semiconductor wafers comprising:
   a first plate;
   a second plate arranged in opposition to siad first plate;
   a plurality of rods arranged between said first and second plates; and
   a plurality of linear supporting members arranged between said plurality of rods, said supporting members functioning to support the semiconductor wafers,
   wherein said rods are deformed outwardly of said first and second plates when the ambient temperature is high.

9. An apparatus according to claim 8, wherein said supporting members are formed of string.

10. An apparatus according to claim 9, wherein sad string comprises heat-resistant string.

11. An apparatus according to claim 8, wherein said plurality of rods comprises four rods and a spacing between a first and a second of said rods and a spacing between a third and a fourth of said rods are each set to be larger than a diameter of the semiconductor wafers supported by said supporting members.

12. A support apparatus comprising:
    a first plate;
    a second plate arranged in opposition to said first plate;
    a plurality of rods arranged between said first and second plates; and
    a plurality of linear supporting members arranged between said plurality of rods, said supporting members functioning to support the semiconductor wafers; and
    at least one spring connected a first end to at least one of said supporting members and fixed at a second end.

13. An apparatus according to claim 12, wherein said spring is formed of silicon carbide (SiC).

14. An apparatus according to claim 12, wherein said at least one spring elongates as an ambient temperature rises.

15. An apparatus according to claim 12, wherein said supporting members are formed of string.

16. An apparatus according to claim 15, wherein said string comprises heat-resistant string.

17. An apparatus according to claim 12, wherein said plurality of rods comprises four rods and a spacing between a first and a second of said rods and a spacing between a third and a fourth of said rods are each set to be larger than a diameter of the semiconductor wafers supported by said supporting members.

18. A support apparatus for supporting semiconductor wafers comprising:
    a first plate;
    a second plate arranged in opposition to said first plate, said second plate having a plurality of slits;
    a plurality of rods arranged between said first and second plates;
    a plurality of strings, first ends of said strings being mounted on said first plate and second ends thereof extending through corresponding slits of said second plate; and
    a plurality of guards respectively provided on said strings, said guards functioning to hold the semiconductor wafer.

19. An apparatus according to claim 18, further comprising weights connected to the second ends of said strings to give a preset tension to said strings.

20. An apparatus according to claim 18, wherein said first ends of said strings are arranged along a circle having a diameter substantially equal to that of the semiconductor wafer.

21. An apparatus according to claim 18, wherein said slits are radially formed in said second plate and the second end portions of said strings move in said slits in a range between the periphery of the semiconductor wafer and an outside portion thereof.

22. An apparatus according to claim 18, wherein said guard is formed of silicon carbide (SiC).

23. An apparatus according to claim 18, wherein said plurality of rods comprises four rods and a spacing between a first and a second of said rods and a spacing between a third and a fourth of said rods are each set to be larger than a diameter of the semiconductor wafers supported by said support members.

24. An apparatus according to claim 18, wherein said strings are formed of a heat-resistant material.

25. An apparatus according to claim 24, wherein said strings are formed of silicon (SiC) fibers.

26. An apparatus according to claim 25, wherein said strings each has a diameter of approximately 0.5 mm.

27. A method for processing semiconductor wafers comprising the steps of:

supporting semiconductor wafers on linear supporting members;

loading the semiconductor wafers supported by the supporting members into a furnace and subjecting the semiconductor wafers to heat treatment; and unloading the semiconductor wafers processed and supported by the supporting members from the furnace, wherein said supporting members are formed of string.

28. A method according to claim 27, wherein said string is formed of silicon carbide (SiC) fibers.

29. A method according to claim 27, wherein said string comprises heat-resistant string.

* * * * *

UNITED STATES PATENT AND TRADEMARK OFFICE
CERTIFICATE OF CORRECTION

PATENT NO. : 6,133,121
DATED : October 17, 2000
INVENTOR(S) : Yoshitaka Tsunashima, et al.

It is certified that error appears in the above-identified patent and that said Letters Patent is hereby corrected as shown below:

Claim 8, column 8,
Line 7, "siad" has been replaced with -- said --.

Claim 23, column 9,
Line 17, "support" has been replace with -- supporting --.

Signed and Sealed this

Twenty-third Day of October, 2001

Attest:

*Nicholas P. Godici*

NICHOLAS P. GODICI
*Attesting Officer*  *Acting Director of the United States Patent and Trademark Office*